United States Patent [19]

Murakami et al.

[11] Patent Number: 4,488,349
[45] Date of Patent: Dec. 18, 1984

[54] METHOD OF REPAIRING SHORTS IN PARALLEL CONNECTED VERTICAL SEMICONDUCTOR DEVICES BY SELECTIVE ANODIZATION

[75] Inventors: Koichi Murakami; Teruyoshi Mihara, both of Yokosuka, Japan

[73] Assignee: Nissan Motor Company, Limited, Japan

[21] Appl. No.: 475,403

[22] Filed: Mar. 15, 1983

[30] Foreign Application Priority Data

Apr. 9, 1982 [JP] Japan .................................. 57-59155
Apr. 10, 1982 [JP] Japan .................................. 57-59940

[51] Int. Cl.³ ..................... H01L 21/76; H01L 21/00; B05D 5/12
[52] U.S. Cl. ...................................... 29/575; 29/571; 148/1.5; 148/187; 204/15
[58] Field of Search .................. 29/571, 575; 148/1.5, 148/187; 204/15

[56] References Cited

U.S. PATENT DOCUMENTS

| | | | |
|---|---|---|---|
| 3,851,245 | 11/1974 | Baker et al. | 29/574 |
| 4,104,090 | 8/1978 | Pogge | 148/175 |
| 4,119,993 | 10/1978 | Hartnagel | 357/23 |
| 4,158,613 | 6/1979 | Sogo | 204/15 |
| 4,242,791 | 1/1981 | Horng et al. | 29/578 |
| 4,393,577 | 7/1983 | Imai | 29/576 B |
| 4,420,497 | 12/1983 | Tickle | 427/8 |

OTHER PUBLICATIONS

Bhattacharyya, IBM-TDB, 15 (1973) 3445.

Primary Examiner—Upendra Roy
Attorney, Agent, or Firm—Lowe, King, Price & Becker

[57] ABSTRACT

A method of repairing shorts in parallel connected vertical semiconductor devices including a plurality of parallel-connected transistors comprises an anodizing step, before the electrodes are formed, in addition to the conventional manufacturing steps. Since defective semiconductor regions due to short circuit, poor withstand voltage or pin holes are insulated from the corresponding electrodes by an insulating material formed in the anodizing step, even if any of parallel-connected transistors are defective, the integrated circuit is usable, thus reducing the percentage of defectiveness of the vertical semiconductor devices in the assembly line production thereof.

12 Claims, 22 Drawing Figures (A)

(B)

(C)

(D)

(A)

(B)

(C)

(D)

(A)

(B)

(C)

(A)

(B)

(C)

(A)

(B)

(C)

(D)

4,488,349

METHOD OF REPAIRING SHORTS IN PARALLEL CONNECTED VERTICAL SEMICONDUCTOR DEVICES BY SELECTIVE ANODIZATION

BACKGROUND OF THE INVENTION

1. Field of the Invention

The present invention relates to a method of repairing shorts in an integrated circuit including a plurality of parallel-connected semiconductor elements such as vertical MOS transistors, vertical bi-polar transistors, etc., and more specifically to a method of lowering the incidence of defects in the assembly line production of the integrated circuit including a plurality of parallel-connected semiconductor elements.

2. Description of the Prior Art

Recently, various vertical semiconductor devices have been widely used in a number of industrial fields. This is because the vertical semiconductor devices are low in power supply voltage, high in input impedance but low in output impedance and high in switching speed, thus being well suitable for various switching circuits.

Typical examples of the above-mentioned vertical semiconductor devices include vertical MOS (Metal Oxide Semiconductor) transistors and vertical bi-polar transistors. In the case where the above-mentioned semiconductor devices are used for a power circuit in the form of an integrated circuit, the MOS transistors or the bi-polar transistors are usually connected in parallel with each other in order to increase the maximum current rated.

However, in the parallel-connected vertical semiconductor device as described above, in case any one of a plurality of semiconductor devices is determined to be defective due to, for instance, short-circuit or poor withstand voltage (poor breakdown voltage), in particular, between source and drain in a MOS transistor or between emitter and collector in a bi-polar transistor, or due to a pin hole formed in an insulating layer, the transistors cannot operate normally because they are connected in parallel with each other, resulting in the whole integrated circuit being discarded as a defective device. Further, in the assembly line production of such vertical semiconductor devices, it is necessary for inspectors to carefully check the short-circuit or poor withstand voltage between source and drain or between emitter and collector at all times and additionally to carefully handle the semiconductor devices.

In other words, in the assembly line production of parallel-connected vertical semiconductor devices, there exists a problem in that incidence of defects is high and therefore the manufacturing cost is also high.

SUMMARY OF THE INVENTION

With these problems in mind, therefore, it is the primary object of the present invention to provide a method of manufacturing vertical semiconductor devices including a step of restoring an integrated circuit including some defective portions caused by short circuit or poor withstand voltage; in other words, a method of reducing the incidence of defects of vertical semiconductor devices in the assembly line.

To achieve the above-mentioned object, the method of repairing shorts in parallel connected vertical semiconductor devices according to the present invention comprises a step of anodizing the substrate with the substrate as an anode, after etching an insulating film into a predetermined common electrode pattern but before forming a predetermined common electrode on the semiconductor regions, in addition to the conventional method of manufacturing a semiconductor device.

Since the anodized material can insulate only the defective semiconductor regions caused by short circuit, poor withstand voltage, or pin holes from the corresponding common electrodes, even if there exist any defective portions, the integrated circuit thus manufactured is usable and therefore the incidence of defects can be reduced in the assembly line.

BRIEF DESCRIPTION OF THE DRAWINGS

The features and advantages of the method of repairing shorts in parallel connected vertical semiconductor devices according to the present invention will be more clearly appreciated from the following description of the preferred embodiments of the invention taken in conjunction with the accompanying drawings in which like reference numerals designate the same or similar materials or portions or sections throughout the figures thereof and in which.

DETAILED DESCRIPTION OF THE PREFERRED EMBODIMENTS

In the case where vertical semiconductor devices such as vertical MOS transistors or vertical bi-polar transistors are used for power switching circuits, a plurality of semiconductor devices are usually connected in parallel with each other in order to increase the maximum current rated.

Figure 1A:
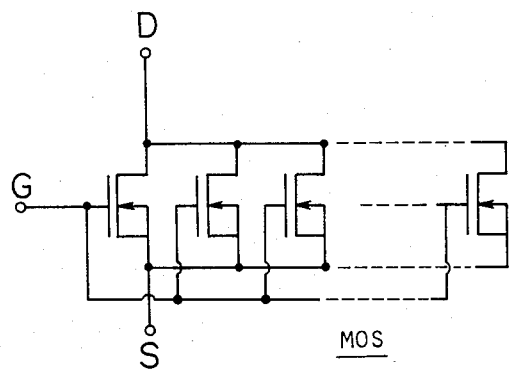
FIG. 1(A) is a basic equivalent circuit diagram of an integrated circuit made up of a plurality of parallel-connected vertical MOS transistors.

FIG. 1(A) shows a typical, basic equivalent circuit diagram of parallel-connected MOS transistors, in which the label G designates a common gate terminal, the label S designates a common source terminal and the label D designates a common drain terminal.

Figure 1B:
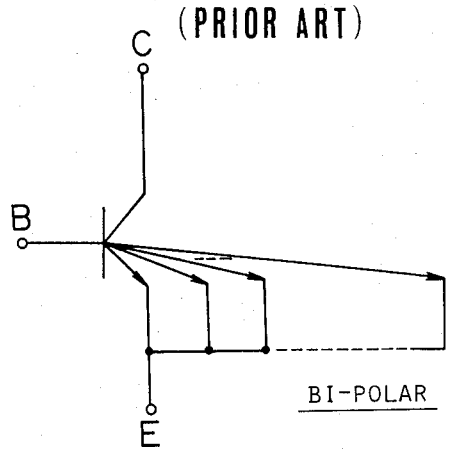
FIG. 1(B) is a basic equivalent circuit diagram of an integrated circuit made up of a plurality of parallel-connected vertical bi-polar transistors.

FIG. 1(B) shows a typical, basic equivalent circuit diagram of parallel-connected bi-polar transistors, in which the label B designates a common base terminal, the label E designates a common emitter terminal, and the label C designates a common collector terminal.

In such a vertical semiconductor device as depicted in FIG. 1(A) or FIG. 1(B), in case any one of a plurality of parallel-connected transistors is defective due to, for instance, short circuit or poor withstand voltage, in particular, between source and drain or between drain and gate in the case of MOS transistors or between emitter and collector in the case of bi-polar transistors, the transistors will not operate normally, that is, the whole integrated circuit will be discarded as a defective device. Further, in the assembly line production of the vertical semiconductor devices, the inspector must check the devices for short circuits or poor withstand voltage at all times and handle these devices carefully. In other words, the incidence of defects in semiconductor devices is high in the assembly line production and therefore the manufacturing cost thereof is also high.

In view of the above description, reference is now made to a first embodiment of the method of repairing shorts in parallel connected a vertical semiconductor devices according to the present invention, in which an aluminum film is changed into aluminum-oxide insulating film by means of anodic oxidation at only a defective portion.

FIGS. 2(A) to 2(D) show the case where the first embodiment of the present invention is applied to parallel-connected MOS transistors for insulating a defective portion at which the drain is shorted to the source.

Figure 2:
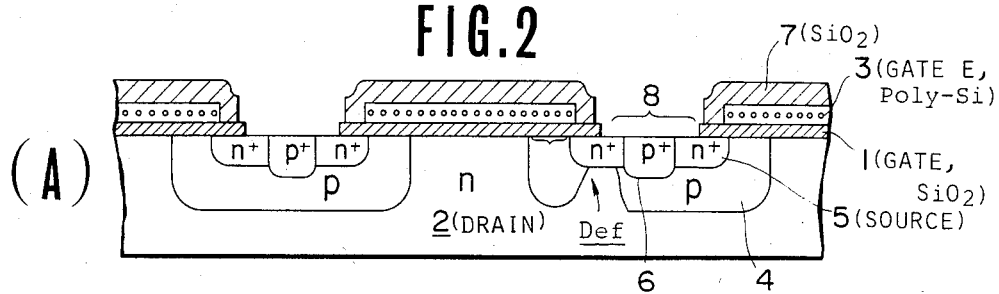
FIGS. 2(A) to 2(D) are cross-sectional views for assistance in explaining a first embodiment of the method of repairing shorts in parallel connected vertical semiconductor devices according to the present invention, which is applied to MOS transistors for insulating a defective source electrode area of a plurality of parallel-connected MOS transistors in such a way that an aluminum conductive thin film is first formed on all the source electrode areas and then only the aluminum film formed on a defective source electrode area is changed into an insulating aluminum-oxide film in anodic oxidation method.
Figure 2:
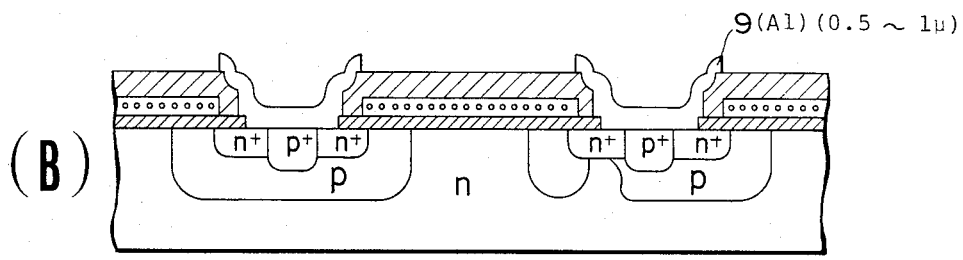
Figure 2:
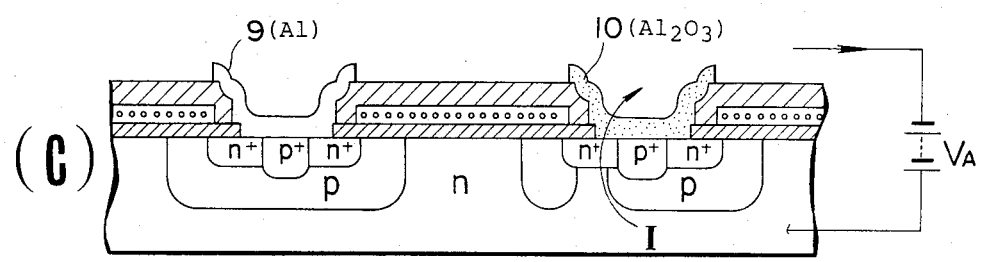
Figure 2:
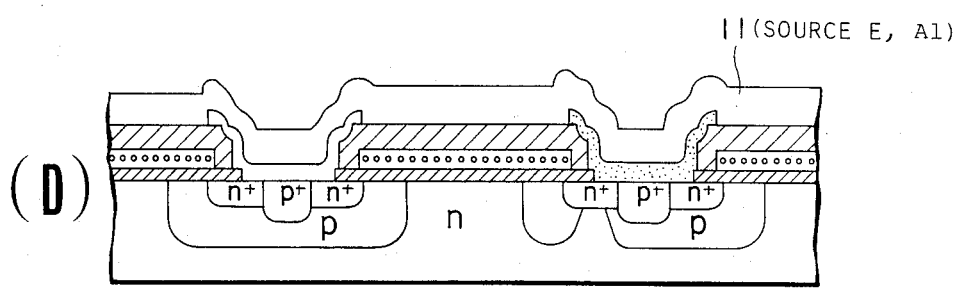

FIG. 2(A) is a cross-sectional view of the MOS transistors obtained by the following steps of: (1) forming a first silicon oxide film (gate) 1 on the surface of a N-type semiconductor substrate (drain) 2 in thermal oxidation method; (2) forming a poly-silicon film (gate electrode) 3 on the first silicon oxide film (gate) 1; (3) forming this poly-silicon gate electrode film 3 into a predetermined common gate electrode pattern and the first silicon oxide film 1 into a predetermined source region pattern in photoetching method; (4) forming P-type wells 4, $N^+$-type source regions 5, and $P^+$-type isolation regions 6 on the exposed drain substrate in ion implantation method or diffusion method; (5) forming a second silicon oxide insulating film 7 thereon; and (6) removing the second silicon oxide film 7 from the positions 8 where the source electrodes are formed in photoetching method. Further, in FIG. 2(A), a normal MOS transistor is illustrated on the left side; an abnormal MOS transistor such that the drain 2 is shorted to the source 5 as designated by Def is illustrated on the right side. The above-mentioned steps of manufacturing MOS transistors are well known in the art.

FIG. 2(B) is a cross-sectional view of the MOS transistors in which an aluminum conductive film 9 is formed on each source electrode area 8, separately, in aluminum vacuum evaporation. The thickness of the aluminum film 9 is approximately from 0.5 to 1 micron.

FIG. 2(C) is a cross-sectional view of the MOS transistors in which the aluminum film 9 formed at a source electrode area 8, under which the drain is shorted to the source, is changed into an aluminum oxide film ($Al_2O_3$) 10 by means of anodic oxidation with the substrate (drain) 2 as an anode. In this embodiment, the anode voltage $V_A$ is so predetermined as to be a little lower than the maximum allowable supply voltage (approximately 100 volts) between the source and the drain of the MOS transistor.

Anodic oxidation or anodization means that when some metals (e.g. Al, Ta, Ti, Nb, and equivalents) are electrolyzed in an appropriate electrolyte with the metal as an anode, an oxidized film which serves as an insulating substance is formed on the surface of the metal. In this case, the thickness of the formed oxidized film depends upon the kind of metal and the anode voltage to be applied thereto. For instance, the anodized film is formed at a rate of 14 angstrom/volt in aluminum or of 17 angstrom/volt in tantalum.

Therefore, in case there exists a short circuit between the N-type semiconductor substrate (drain) 2 and the $N^+$-type source region 5 or the withstand voltage is poor therebetween, a large current I readily flows through only the defective portion Def, so that the entire aluminum conductive film 9 or only the surface of the film 9 is anodized into aluminum oxide ($Al_2O_3$) which serves as an insulating film.

FIG. 2(D) is a cross-sectional view of the MOS transistors in which an aluminum film 11 is additionally formed on the surface of the substrate as a common source electrode portion in aluminum vacuum evaporation method, the thickness of which is approximately 1 to 2 micron. Thereafter, the aluminum source electrode is formed into a predetermined pattern (not shown) in photoetching method, in order to make a common source electrode.

Further, before the step of forming the aluminum source electrode 11 shown in FIG. 2(D), it is preferable to etch the aluminum conductive film 9 formed on the normal transistor shown on the right side with a HF buffer liquid in order to remove a thin anodized film formed thereon when leakage current is passed in the step of anodic oxidation. This is because it is possible to ensure the electric connection between the non-defective aluminum conductive film 9 and the source electrode 11 by removing the anodized film completely.

In the vertical MOS transistors repaired in accordance with the above-mentioned method, the source electrode 11 is electrically connected to the source area 5 through the aluminum conductive film 9 at the normal transistor portions; however, the source electrode 11 is automatically insulated from the source region 5 by the aluminum-oxide insulating film 10 at the abnormal transistor portions at which the drain is shorted to the source or drain is connected to the source with a poor withstand voltage. In other words, even if there exists a defective transistor among a plurality of MOS transistors, the defective transistor will not operate while the other transistors are in operation, thus allowing the vertical MOS transistors including some defective transistors to be usable.

Further, in the embodiment as described above, although aluminum is used for the thin conductive film 9 and the source electrode 11, it is of course possible to use another metal for the film 9 and the source electrode 11. Furthermore, it is unnecessary to use the same material for these two portions 9 and 11.

As the electrolyte used for the above-mentioned anodic oxidation, it is desirable to use the one not including alkaline ions such as $Na^1$, $K^1$, and equivalents. Further, as the solvent, N-methyl acetoamido, ethylene glycol, tetra-hydrofurfurol and equivalents may be used; as the solute, it is possible to use ammonium nitrate or nitric acid and equivalents.

Further, in the above-mentioned anodic oxidation, it is possible to use oxygen plasma, in place of using electrolyte. In this plasma anodic oxidation, the surface of the silicon substrate can be oxidized by applying a predetermined positive voltage to the silicon substrate within oxygen plasma excited by a several-hundred-kilohertz microwave under pressure of 0.1 Torr. In this case, the speed of oxidation and the thickness of the oxidized film can be controlled according to the degree of concentration oxygen plasma, the voltage applied to the silicon substrate and the temperature of the silicon substrate.

Furthermore, the method of anodic oxidation is described in greater detail in various documents, for instance, Journal of the Electrochemical Society, Volume 103, No. 4 (1957), Pages 230 to 236, By P. F. Schmidt and W. Michel.

FIGS. 3(A) to 3(D) show the case where the first embodiment of the method of repairing shorts in parallel connected vertical semiconductor devices according to the present invention is applied to parallel-connected bi-polar transistors for insulating a defective portion at which the collector is shorted to the emitter.

Figure 3:
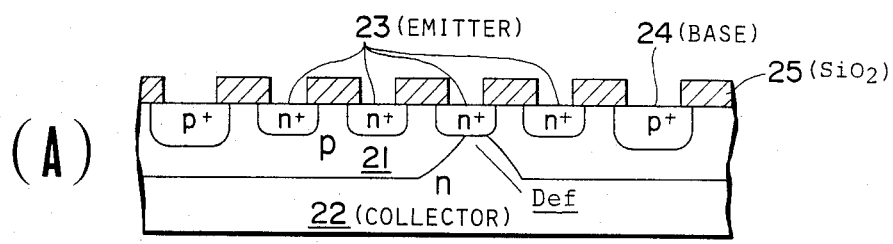
FIGS. 3(A) to 3(D) are cross-sectional views for assistance in explaining the first embodiment of the method of repairing shorts in parallel connected vertical semiconductor devices according to the present invention, which is applied to bi-polar transistors for insulating a defective emitter electrode area of a plurality of parallel-connected bi-polar transistors in such a way that an aluminum conductive thin film is first formed on all the emitter electrode areas and then only the aluminum film formed on a defective emitter electrode area is changed into an insulating aluminum-oxide film in anodic oxidation method.
Figure 3:
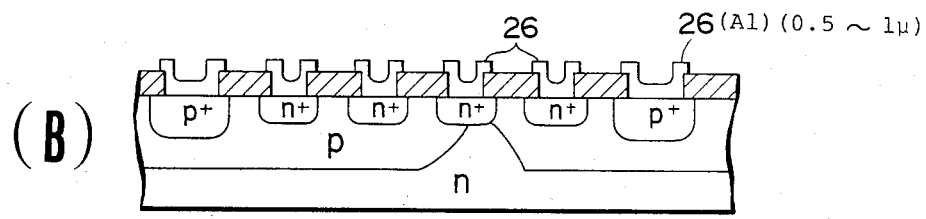
Figure 3:
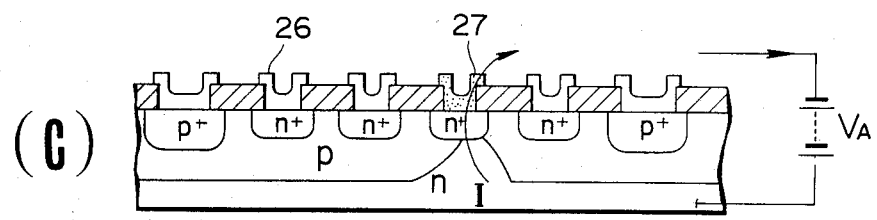
Figure 3:
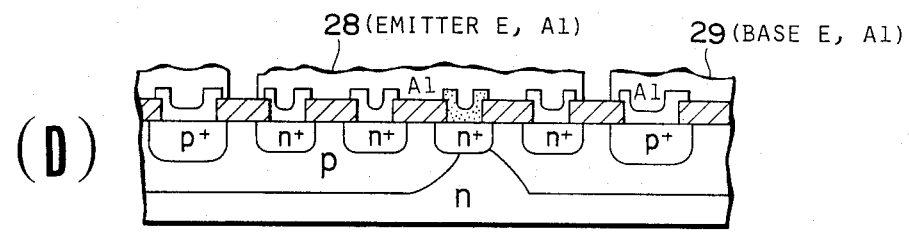

FIG. 3(A) is a cross-sectional view of bi-polar transistors obtained by the following steps of: (1) forming a P-type region 21 on the surface of a N-type semiconductor substrate (collector) 22 in vapor growth (vapor phase epitaxy) method; (2) forming $N^1$-type emitter regions 23 and $P^1$-type base regions 24 on this P-type region 21 in ion implantation or diffusion method; (3) forming a silicon-oxide insulating film 25 thereon in thermal oxidation method; and (4) removing the silicon oxide film 25 from the positions where the base electrodes and the emitter electrodes are formed in photoetching method. In FIG. 3(A), label Def designates an abnormal state where the collector 22 is shorted to the emitter 23. The above-mentioned steps of manufacturing bi-polar transistors are well known in the art.

FIG. 3(B) is a cross-sectional view of the bipolar transistors in which an aluminum conductive film 26 is formed on each emitter electrode area 23 and each base electrode area 24, separately, in aluminum vacuum evaporation method. The thickness of the aluminum films 26 is approximately from 0.5 to 1 micron.

FIG. 3(C) is a cross-sectional view of the bi-polar transistors in which an aluminum film 26 formed at an emitter electrode area 23, under which the collector 22 is shorted to the emitter, is changed into an aluminum oxide film ($Al_2O_3$) 27 by means of anodic oxidation with the substrate (collector) 22 as an anode. In this case, the anode voltage is so determined as to be a little lower than the maximum allowable supply voltage between emitter and collector. Therefore, in case there exists a short circuit between the N-type semiconductor substrate or collector 22 and the $N^1$-type emitter region 23 or the withstand voltage is poor therebetween, a large current I readily flows through the defective portion Def, so that the entire aluminum conductive film 27 or only the surface of the film 27 is anodized into aluminum oxide ($Al_2O_3$) which serves as an insulating film.

FIG. 3(D) is a cross-sectional view of the bi-polar transistors in which an aluminum film is additionally formed on the surface of the substrate as common base and emitter electrode portions in aluminum vacuum evaporation method. Thereafter, the aluminum emitter electrode 28 and the aluminum base electrode 29 are formed into predetermined patterns (not shown) in photoetching method, in order to make common emitter and base electrodes.

Further, before the step of forming the aluminum emitter and base electrodes 28 and 29 shown in FIG. 3(D), it is preferable to etch the aluminum conductive film 26 formed on a normal transistor with a HF buffer liquid in order to remove a thin anodized film formed thereon when leakage current is passed in the step of anodic oxidation. This is because it is possible to ensure the electric connection between the non-defective aluminum conductive film 26 and the emitter and base electrodes 28 and 29 by removing the anodized film completely.

In the vertical bi-polar transistors manufactured in accordance with the above-mentioned method, the emitter electrode 28 or the base electrode 29 is connected to the emitter region 23 or the base region 24 through the aluminum conductive film 26 at the normal transistor portion; however, the emitter electrode 28 is automatically insulated from the emitter region 23 by the aluminum-oxide insulating film 27 at the abnormal transistor portion in which the collector 22 is shorted to the emitter 23 or the collector 22 is connected to the emitter 23 with a poor withstand voltage. In other words, even if there exists a defective transistor among a plurality of bi-polar transistors, the defective transistor will not operate while the other transistors are in operation, thus allowing the vertical bi-polar transistors including some defective transistors to be usable.

As described above, in the first embodiment of the method of repairing shorts in parallel connected vertical semiconductor devices, two steps of forming an aluminum conductive film on each electrode area and of anodizing the formed aluminum conductive film into aluminum oxide film with the substrate as an anode are additionally provided between the step of removing the insulating film from the positions where the electrodes are formed and the step of forming an aluminum electrode film on each electrode area, in order to insulate defective regions from the common electrodes.

A second embodiment of the method of repairing shorts in parallel connected a vertical semiconductor devices according to the present invention will be described hereinbelow, in which semiconductor material is directly changed into silicon-oxide insulating film by means of anodic oxidation.

Figure 4:
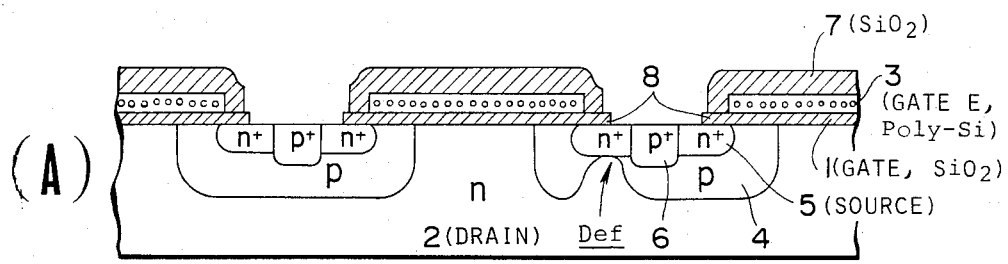
FIGS. 4(A) to 4(C) are cross-sectional views for assistance in explaining the second embodiment of the method of repairing shorts in parallel connected vertical semiconductor devices according to the present invention, which is applied to MOS transistors for insulating a defective source electrode area of a plurality of parallel-connected MOS transistors in such a way that the defective source area is directly changed into an insulating silicon-oxide film in anodic oxidation method.
Figure 4:
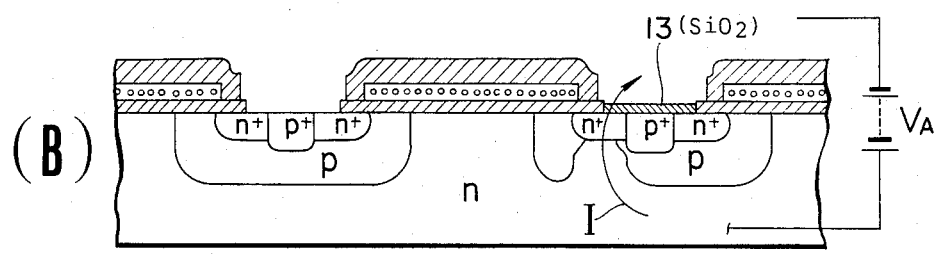
Figure 4:
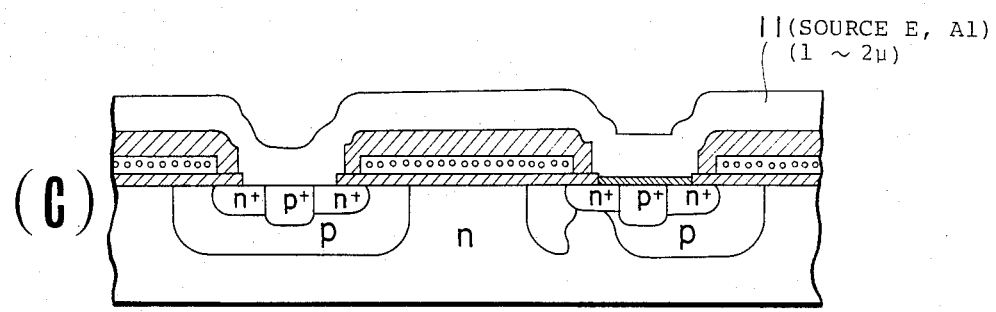

FIGS. 4(A) to 4(C) show the case where the second embodiment of the present invention is applied to parallel-connected MOS transistors for insulating a defective portion at which the drain is shorted to the source.

FIG. 4(A) is a cross-sectional view of the MOS transistors obtained by the following steps of: (1) forming a first silicon oxide film (gate) 1 on the surface of a N-type semiconductor substrate (drain) 2 in thermal oxidation method; (2) forming a poly-silicon film (gate electrode) 3 on the first silicon oxide film (gate) 1; (3) forming this poly-silicon gate electrode film 3 into a predetermined common gate electrode pattern and the first silicon oxide film 1 into a predetermined source region pattern is photoetching method; (4) forming P-type wells 4, N+-type source regions 5, and P+-type isolation regions 6 on the exposed drain substrate in ion implantation method or diffusion method; (5) forming a second silicon oxide insulating film 7 thereon; and (6) removing the second silicon oxide film 7 from the positions 8 where the source electrodes are formed in photoetching method. Further, in FIG. 4(A), a normal MOS transistor is illustrated on the left side; an abnormal MOS transistor such that the drain 2 is shorted to the source 5 as designated by Def is illustrated on the right side. The above-mentioned steps of manufacturing MOS transistors are well known in the art.

FIG. 4(B) is a cross-sectional view of the MOS transistors in which the N+-type source region 5 and the P+-type isolation region 6, under which the drain is shorted to the source region, is changed into a silicon-oxide anodized film (SiO$_2$) 13 by means of anodic oxidation with the substrate (drain) 2 as an anode. In this embodiment, the anode voltage $V_A$ is so determined as to be a little lower than the maximum allowable supply voltage between the source and the drain of the MOS transistor.

Further, in this embodiment, the thickness of the formed oxidized film depends upon the anode voltage $V_A$, electrolyte, current density, etc. However, the the anodized film is usually formed at a rate of from 4 to 10 angstrom/volt in the semiconductor material.

Therefore, in case there exists a short circuit between the N-type semiconductor substrate (drain) 2 and the N+-type source region 5 or the withstand voltage is poor therebetween, a large current I readily flows through the defective portion Def, so that the entire N+-type and the P+-type regions 5 and 6 or only the surface of the regions is anodized into silicon oxide (SiO$_2$) which serves as an insulating film.

FIG. 4(C) is a cross-sectional view of the MOS transistors in which an aluminum film 11 is additionally formed on the surface of the substrate as a common source electrode portion in aluminum vacuum evaporation method, the thickness of which is approximately 1 to 2 micron. Thereafter, the aluminum source electrode is formed into a predetermined pattern (not shown) in photoetching method, in order to make a common source electrode.

Further, before the step of forming the aluminum source electrode 11 shown in FIG. 4(C), it is preferable to etch the surface of the source region 5 formed on a normal transistor shown on the right side with a HF buffer liquid in order to remove a thin anodized film formed thereon when leakage current is passed in the step of anodic oxidation. This is because it is possible to ensure the electric connection between the source region 5 and the source electrode 11 by removing the anodized film completely.

In the vertical MOS transistors repaired in accordance with the above-mentioned method, the source electrode 11 is directly connected to the source region 5 at the normal transistor portion; however, the source electrode 11 is automatically insulated from the source region 5 by the silicon-oxide insulating film 10 at the abnormal transistor portion in which the source is shorted to the drain or the source is connected to the drain with a poor withstand voltage. In other words, even if there exists a defective transistor among a plurality of MOS transistors, the defective transistor will not operate while the other transistors are in operation, thus allowing the vertical MOS transistors including some defective transistors to be usable.

As the electrolyte used for the above-mentioned anodic oxidation, it is desirable to use the one not including alkaline ions such as Na$^+$, K$^+$, and equivalents. As the solvent, N-methyl acetoamido, ethylene glycol, tetrahydro furfurol and equivalents may be used as the solute, it is possible to use ammonium nitrate or nitric acid and equivalents.

Figure 5:
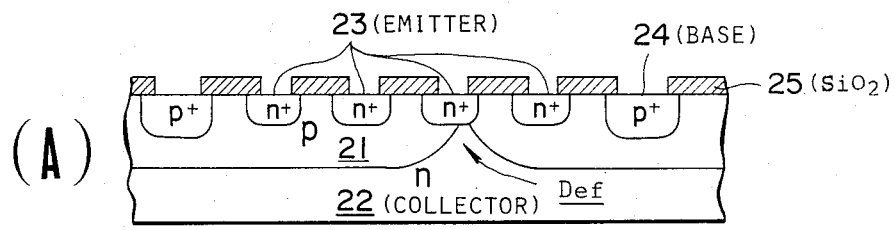
FIGS. 5(A) to 5(C) are cross-sectional views for assistance in explaining the second embodiment of the method of repairing shorts in parallel connected vertical semiconductor devices according to the present invention, which is applied to bi-polar transistors for insulating a defective emitter electrode area of a plurality of parallel-connected bi-polar transistors in such a way that the defective emitter area is directly changed into an insulating silicon-oxide film in anodic oxidation method.
Figure 5:
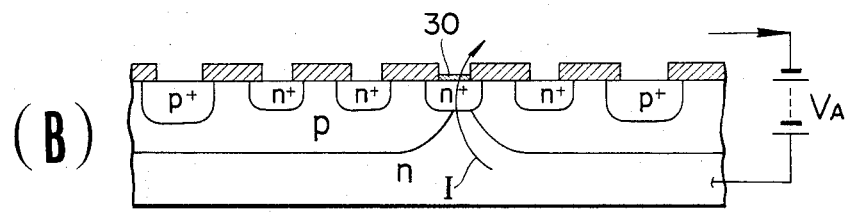
Figure 5:
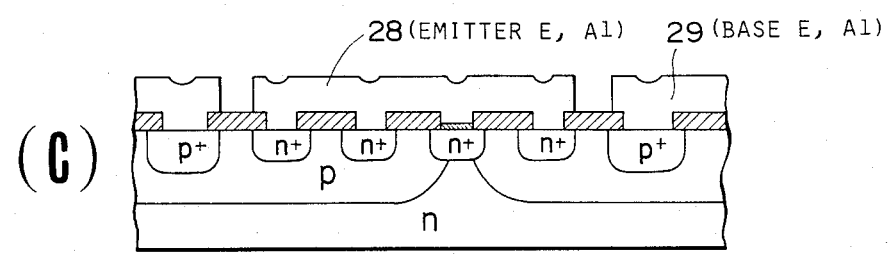

FIGS. 5(A) to 5(C) show the case where the second embodiment of the method of manufacturing a vertical semiconductor device according to the present invention is applied to parallel-connected bi-polar transistors for insulating a defective portion at which the collector is shorted to the emitter.

FIG. 5(A) is a cross-sectional view of bi-polar transistors obtained by the following steps of: (1) forming a P-type base region 21 on the surface of a N-type semiconductor substrate (collector) 22 in vapor growth (vapor phase epitaxy) method; (2) forming N+-type emitter regions 23 and P+-type base regions 24 on this P-type region 21 in ion implantation or diffusion method; (3) forming a silicon-oxide insulating film 25 thereon in thermal oxidation method; and (4) removing the silicon oxide film 25 from the positions where the base electrodes and the emitter electrodes are formed in photoetching method. In FIG. 5(A), label Def designates an abnormal state where the collector 22 is shorted to the emitter 23. The above-mentioned steps of manufacturing bi-polar transistors are well known in the art.

FIG. 5(B) is a cross-sectional view of the bi-polar transistors in which the N+-type emitter region 23, under which the collector 22 is shorted to the emitter 23, is changed into a silicon-oxide anodized film (SiO$_2$) 30 by means of anodic oxidation with the substrate (collector) 22 as an anode. In this embodiment, the anode voltage $V_A$ is so determined as to be a little lower than the maximum allowable supply voltage between the collector and the emitter of the bi-polar transistor. Therefore, in case there exists a short circuit between the N-type semiconductor substrate or collector 22 and the N+-type emitter region 23 or the withstand voltage is poor therebetween, a large current I readily flows through the defective portion Def, so that the entire N+-type region 23 or only the surface of the region is anodized into silicon oxide (SiO2) which serves as an insulating film.

FIG. 5(C) is a cross-sectional view of the bi-polar transistors in which an aluminum film is additionally formed on the surface of the substrate as the common base and emitter electrode portions in aluminum vacuum evaporation method. Thereafter, the aluminum emitter electrode 28 and the aluminum base electrode 29 are formed into predetermined patterns in photoetching method, in order to make common emitter and base electrodes.

Further, before the step of forming the aluminum emitter and base electrodes 28 and 29 shown in FIG. 3(C), it is preferable to etch the surface of the emitter and base regions 23 and 24 formed on a normal transistor with a HF buffer liquid in order to remove a thin anodized film formed thereon when leakage current is passed in the step of anodic oxidation. This is because it is possible to ensure the electric connection between the non-defective emitter and base regions 23 and 24 and the emitter and base electrodes 28 and 29 by removing the anodized film completely.

In the vertical bi-polar transistors repaired in accordance with the above-mentioned method, the emitter electrode 28 or the base electrode 29 is directly connected to the emitter region 23 or the base region 24 at the normal transistor portion; however, the emitter electrode 28 is automatically insulated from the emitter region 23 by the silicon-oxide insulating film 30 at the abnormal transistor portion in which the collector 22 is shorted to the emitter 23 or the collector 22 is connected to the emitter 23 with a poor withstand voltage. In other words, even if there exists a defective transistor among a plurality of bi-polar transistors, the defective transistor will not operate while the other transistors are in operation, thus allowing the vertical bi-polar transistors including some defective transistors to be usable.

As described above, in the second embodiment of the method of repairing shorts in parallel connected vertical semiconductor devices, a step of anodizing the emitter or base region into silicon oxide film with the substrate as an anode are additionally provided between the step of removing the insulating film from the positions where the electrodes are formed and the step of forming an aluminum electrode film on each electrode area, in order to insulate defective regions from the common electrodes.

A third embodiment of the method of repairing shorts in parallel connected vertical semiconductor devices according to the present invention will be described hereinbelow, in which a polysilicon film is changed into silicon-oxide insulating film by means of anodic oxidation.

FIGS. 6(A) to 6(D) show the case where the third embodiment of the present invention is applied to MOS transistors for insulating a defective portion at which the N-type region (drain) is shorted to the poly-silicon film (gate electrode) through a pin hole.

FIG. 6(A) is a cross-sectional view of a device obtained by the step of forming a silicon oxide gate film 1 on a predetermined gate region of a N-type semiconductor substrate 2 on which MOS transistors are configured. In FIG. 6(A), label PH denotes an abnormal state where the substrate (drain) is shorted to the silicon oxide gate film 1 via a pin hole.

FIG. 6(B) is a cross-sectional view of a device obtained by forming a plurality of 100-micron square polysilicon gate electrodes 3 separated by gaps of about several microns. The thickness of the electrodes 3 is about 0.01 micron and dopant (impurity atoms) is mixed with the poly-silicon by doping in or after depositing the poly-silicon on the substrate in order to increase its conductivity.

FIG. 6(C) is a cross-sectional view of the device in which the poly-silicon gate electrode 3, under which the drain 2 is shorted to the gate electrode 3 via a pin hole PH, is changed into a silicon oxide insulating film (SiO2) 13 by means of anodic oxidation with the substrate (drain) 2 as an anode. In this case, the anode voltage is so determined as to be a little lower than the withstand voltage of the silicon oxide gate film 1 (approximately 60 volts).

Therefore, in case there exists a pin hole in the silicon oxide gate film 1, a large current readily flows through the pin hole, so that the poly-silicon gate electrode 1 is anodized into a thicker silicon oxide insulating film (SiO2) 13. In this embodiment, the thickness of the insulating film 13 is about 0.02 micron, which is twice as thick as that of poly-silicon gate electrode 1.

FIG. 6(D) shows a cross-sectional view of the device in which poly-silicon is further deposited throughout the gate area to form another gate electrode 3', the thickness of which is about 0.3 to 0.4 micron. Thereafter, the poly-silicon film (gate electrode) 3' is formed into a predetermined gate electrode pattern in photoetching method; P-type wells, N+-type source regions 5, and P+-type isolation regions are formed in ion implantation method or diffusion method; another silicon oxide insulating film is formed; the insulating film is removed from the positions where the source electrodes are formed in photoetching method; the source electrode are formed in aluminum vacuum evaporation method; lastly, the source electrode is formed into a predetermined pattern in photoetching method, in order to make a common source electrode.

Figure 6:
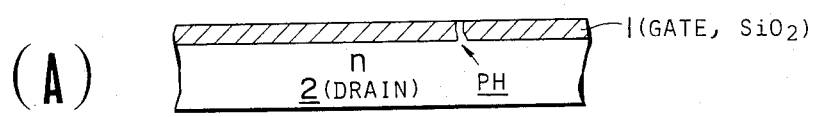
FIGS. 6(A) to 6(D) are cross-sectional views for assistance in explaining the second embodiment of the method of repairing shorts in parallel connected vertical semiconductor devices according to the present invention, which is applied to MOS transistors for insulating a defective gate electrode area of a plurality of parallel-connected MOS transistors in such a way that the defective poly-silicon gate electrode area is directly changed into an insulating silicon oxide film in anodic oxidation method.
Figure 6:
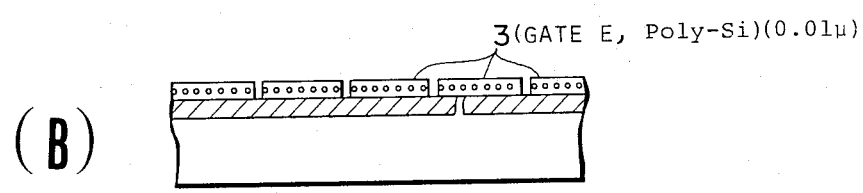
Figure 6:
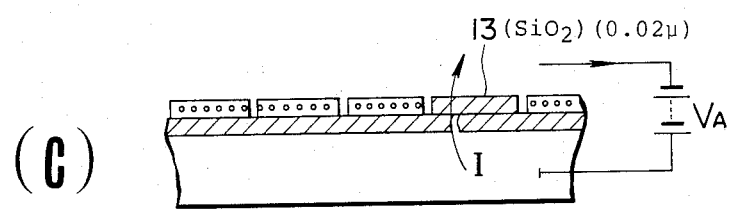
Figure 6:
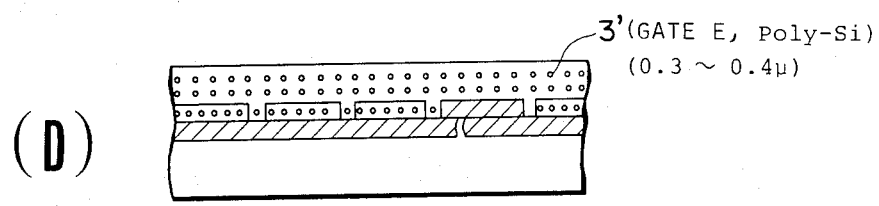
Figure 7:
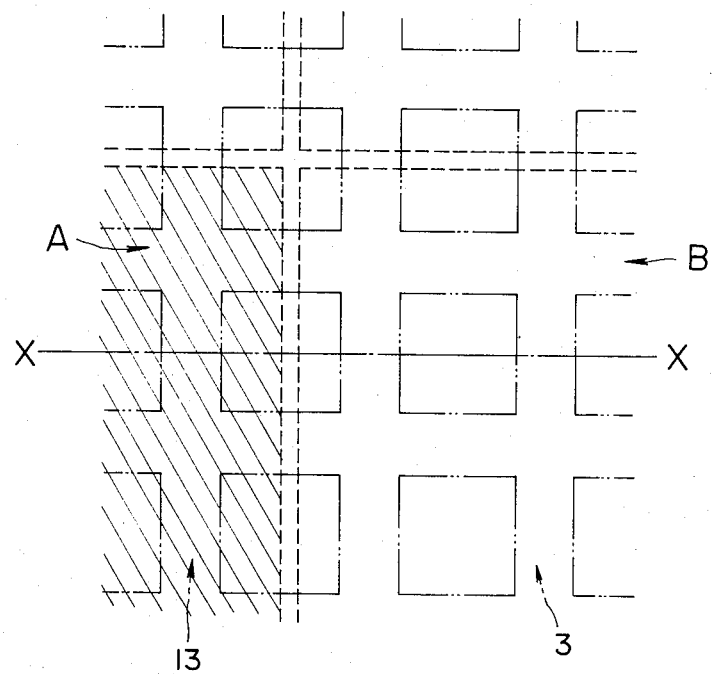
FIG. 7 is a plan view of the vertical MOS transistors repaired in accordance with the method of the present invention described with reference to FIGS. 6(A) to 6(D)

FIG. 7 shows a plan view of the device shown in FIG. 6, in which the shaded portion A indicates the area where the anodized film 13 is additionally formed due to the presence of pin holes and the dot-dot-dashed lines indicates the MOS transistor portions formed on the substrate.

Figure 8:
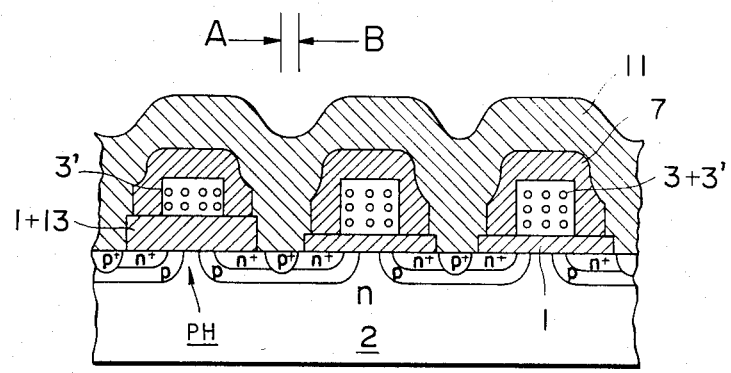
FIG. 8 is a cross-sectional view of the vertical MOS transistors taken along the line X—X shown in FIG. 7.

FIG. 8 shows a cross-sectional view taken along the line X—X shown in FIG. 7. This figure indicates that although the thickness of the anodized silicon oxide insulating film 13 formed in the area A is approximately twice as thick as that of the non-anodized silicon oxide insulating film 1 formed in the area B, poor insulation due to pin holes can be eliminated, so that all the transistors can operate normally.

As described above, in the method of repairing shorts in parallel connected vertical semiconductor devices according to the present invention, since an additional anodizing step is provided with the substrate as an anode, before forming common electrodes, in order to insulate defective portions due to short-circuit, poor withstand voltage, pin hole, etc. from the common electrodes, it is possible to restore an integrated circuit including some defective portions, thus reducing the incidence of defects of parallel-connected semiconductor devices in the assembly line production thereof.

It will be understood by those skilled in the art that the foregoing description is in terms of preferred embodiments of the present invention wherein various changes and modifications may be made without departing from the spirit and scope of the invention, as set forth in the appended claims.

What is claimed is:

1. A method of repairing shorts in parallel connected vertical semiconductor devices by selective anodization, which comprises the steps of:
   (a) forming electrode regions on a substrate by etching an insulating film formed on the substrate;
   (b) anodizing the electrode regions with the substrate as an anode; and
   (c) forming a common electrode on the electrode regions,
   whereby only defective electrode regions are anodized into silicon oxide for insulating the defective electrode regions from the common electrode.

2. A method of repairing shorts in parallel connected vertical semiconductor devices as set forth in claim 1, which further comprises a step of forming a metal film on each electrode region, after the step of forming electrode regions on each substrate by etching an insulating film formed on the substrate.

3. A method of repairing shorts in parallel connected vertical semiconductor devices as set forth in claim 2, which further comprises a step of etching the substrate to remove the anodized film formed in the step of anodizing the electrode regions, before forming the common electrode.

4. A method of repairing shorts in parallel connected vertical semiconductor devices as set forth in claim 1, wherein the anode voltage applied to the substrate is a little lower than a maximum allowable voltage between the substrate and the electrode.

5. A method of repairing shorts in parallel connected vertical semiconductor devices as set forth in claim 2, wherein said metal film is aluminum film with a thickness of about 0.5 to 1 micron, said aluminum being anodized into aluminum oxide when anodized.

6. A method of repairing shorts in parallel connected vertical semiconductor devices by selective anodization which comprises the steps of:
   (a) forming a first silicon oxide gate film on a surface of a N-type semiconductor drain substrate;
   (b) forming a poly-silicon gate electrode film on the first silicon oxide gate film;
   (c) etching the poly-silicon gate electrode film into a predetermined gate electrode pattern and the first silicon oxide film into a predetermined source region pattern;
   (d) forming a P-type wells, N+-type source regions and P+-type isolation region on the exposed N-type semiconductor drain substrate to provide a plurality of source regions;
   (e) forming a second silicon oxide insulating film on the substrate;
   (f) etching the second silicon oxide insulating film into a predetermined source region pattern;
   (g) anodizing the substrate with the substrate as an anode;
   (h) forming an aluminum conductive film on the substrate; and
   (i) etching the aluminum conductive film into a predetermined common source electrode connected to a plurality of the source regions;
   whereby only defective source regions are anodized into silicon oxide for insulating the defective source regions from the aluminum common source electrode.

7. A method of repairing shorts in parallel connected vertical semiconductor devices as set forth in claim 6, which further comprises the step of forming an aluminum conductive film on each source region, after the step of etching the second silicon oxide insulating film into a predetermined source region pattern but before the step of anodizing the substrate,
   whereby only aluminum conductive films on defective source regions are anodized into aluminum oxide for insulating the defective source regions from the aluminum common source electrode.

8. A method of repairing shorts in parallel connected vertical semiconductor devices as set forth in claim 6, which further comprises the steps of:
   (a) anodizing the substrate with the substrate as an anode, after the step of etching the poly-silicon gate electrode film into a predetermined gate electrode pattern; and
   (b) further forming another poly-silicon gate electrode film on the anodized substrate,
   whereby only defective poly-silicon gate electrodes are anodized into silicon oxide for insulating the gate electrode from the drain substrate.

9. A method of repairing shorts in parallel connected vertical semiconductor devices as set forth in any of claim 6, 7 or 8, which further comprises the step of etching the substrate to remove the anodized film formed in the step of anodizing the substrate, before the step of forming the aluminum conductive film on the substrate.

10. A method of repairing shorts in parallel connected vertical semiconductor devices by selective anodization which comprises the following steps of:
    (a) forming a P-type region on a surface of a N-type semiconductor collector substrate;
    (b) forming N+-type emitter regions and P+-type base regions on the P-type region;
    (c) forming a silicon oxide film on the substrate;
    (d) etching the silicon oxide film into a predetermined emitter electrode pattern and a predetermined base electrode pattern;
    (e) anodizing the substrate with the substrate as an anode;
    (f) forming an aluminum conductive film on the substrate; and
    (g) etching the aluminum conductive film into a predetermined common emitter electrode connected to a plurality of the emitter regions and into a predetermined common base electrode connected to a plurality of the base regions,
    whereby only defective emitter regions are anodized into silicon oxide for insulating the defective emitter from the common emitter electrode.

11. A method of repairing shorts in parallel connected vertical semiconductor devices as set forth in claim 10, which further comprises the step of forming an aluminum conductive film on each emitter and base region, after the step of etching the silicon oxide film into a predetermined emitter region pattern and a predetermined base region pattern but before the step of anodizing the substrate,
    whereby only aluminum conductive films on defective emitter are anodized into aluminum oxide for insulating the defective emitter from the common emitter electrode.

12. A method of repairing shorts in parallel connected vertical semiconductor devices as set forth in either claim 10 or 11, which further comprises the step of etching the substrate to remove the anodized film formed in the step of anodizing the substrate, before the step of forming the aluminum conductive film on the substrate.

* * * * *